United States Patent [19]

Iwasaki et al.

[11] Patent Number: 4,694,562
[45] Date of Patent: Sep. 22, 1987

[54] METHOD FOR MANUFACTURING A SEMICONDUCTOR INTEGRATED DEVICE INCLUDING BIPOLAR AND CMOS TRANSISTORS

[75] Inventors: Hiroshi Iwasaki, Chigasaki; Shintaro Ito, Yokohama, both of Japan

[73] Assignee: Kabushiki Kaisha Toshiba, Kawasaki, Japan

[21] Appl. No.: 925,266

[22] Filed: Oct. 31, 1986

Related U.S. Application Data

[63] Continuation of Ser. No. 847,150, Apr. 3, 1986, Pat. No. 4,637,125, which is a continuation of Ser. No. 652,087, Sep. 19, 1984, abandoned.

[30] Foreign Application Priority Data

Sep. 22, 1983 [JP] Japan ................................ 58-175363
Sep. 28, 1983 [JP] Japan ................................ 58-179558

[51] Int. Cl.⁴ .......................................... H01L 21/38
[52] U.S. Cl. ...................................... 437/57; 437/33; 437/41
[58] Field of Search ................ 29/571, 576 E, 576 W, 29/577 C; 148/175, 187, 188

[56] References Cited

U.S. PATENT DOCUMENTS

| | | | |
|---|---|---|---|
| 3,576,475 | 4/1971 | Kronlage | 357/43 X |
| 4,038,680 | 7/1977 | Yagi et al. | 357/40 X |
| 4,168,997 | 9/1979 | Compton | 148/175 |
| 4,225,877 | 9/1980 | Miles et al. | 357/43 X |
| 4,272,776 | 6/1981 | Weijland et al. | 357/44 X |
| 4,346,512 | 8/1982 | Liang et al. | 29/571 |
| 4,403,395 | 9/1983 | Curran | 148/187 |
| 4,484,388 | 11/1984 | Iwasaki | 29/571 |
| 4,507,847 | 4/1985 | Sullivan | 29/577 C |
| 4,529,456 | 7/1985 | Anzai et al. | 29/577 C |
| 4,637,125 | 1/1987 | Iwasaki et al. | 148/187 X |

FOREIGN PATENT DOCUMENTS 10984 1/1978 Japan .

OTHER PUBLICATIONS

IBM Tech. Discl. Bull., vol. 16, No. 8, Jan. 1974, pp. 2701-2703.

Primary Examiner—George T. Ozaki
Attorney, Agent, or Firm—Finnegan, Henderson, Farabow, Garrett & Dunner

[57] ABSTRACT

A semiconductor integrated device (CBi-CMOS) is disclosed wherein both CMOS transistors and a vertical npn and pnp transistor are formed in a single semiconductor substrate and a latch up phenomenon in the CMOS is prevented. A method of manufacturing the CBi-CMOS is also disclosed. In the CBi-CMOS, four elements, that is, an n-MOSFET, a p-MOSFET and npn and pnp vertical transistors are formed in an n-type epitaxial silicon layer formed on a p-type silicon substrate. The n-MOSFET is formed in a p-well which has a p⁺-type buried region. In the element region of the p-MOSFET, an n⁺-type buried region is also formed. In the element regions of the npn and pnp vertical transistors, a first p⁺-type isolation diffusion region is selectively formed. And an n⁺-type buried region is selectively formed both in these element region of the npn and pnp vertical transistors. In the element region of the npn transistor, the vertical npn transistor is formed using the n-type region surrounded by the first p⁺-type isolation diffusion region as a collector. In the element region of the pnp transistor, a p⁺-type buried region is formed on the n⁺-type buried region, and the vertical pnp transistor is formed using the p⁺-type buried region as a collector. In this case, a second p⁺-type isolation diffusion region is formed to isolate an n-type base region of the vertical pnp transistor.

2 Claims, 18 Drawing Figures

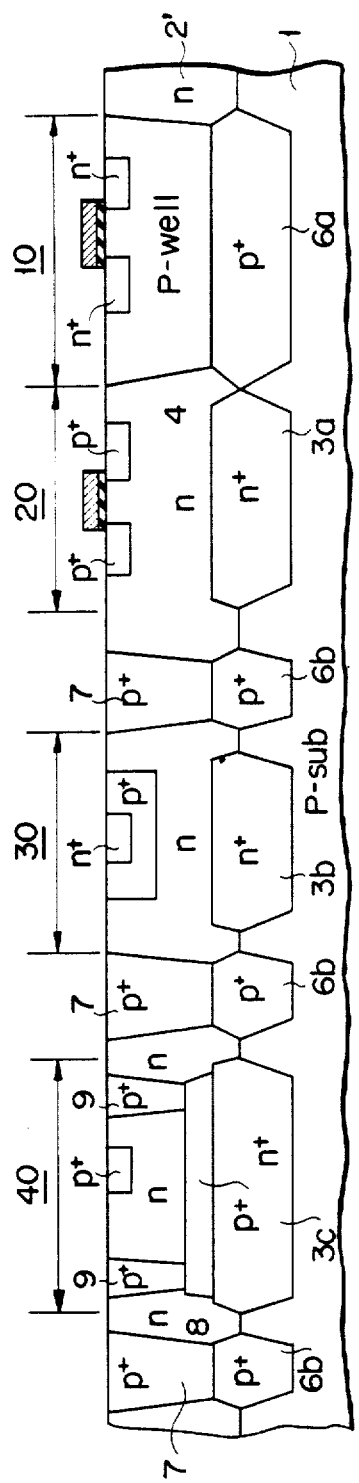
F I G. 3
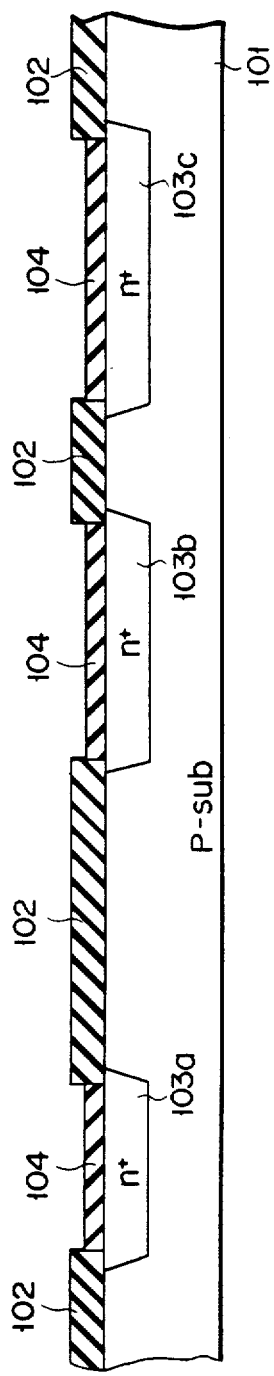
F I G. 4A

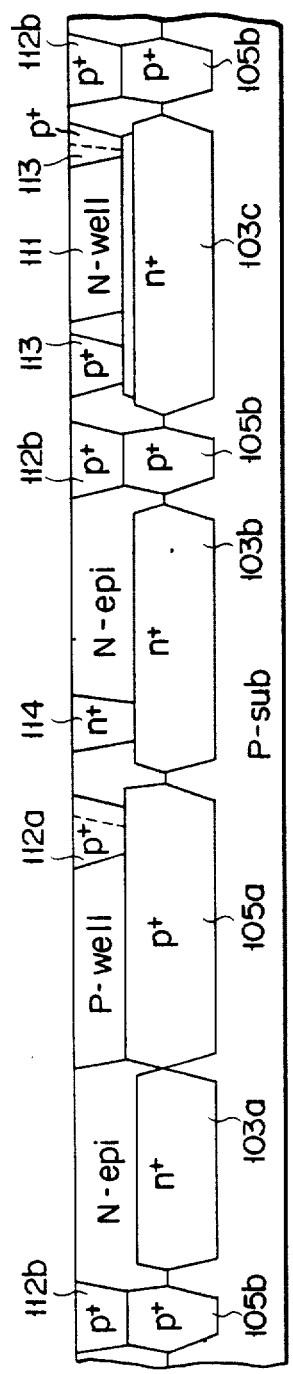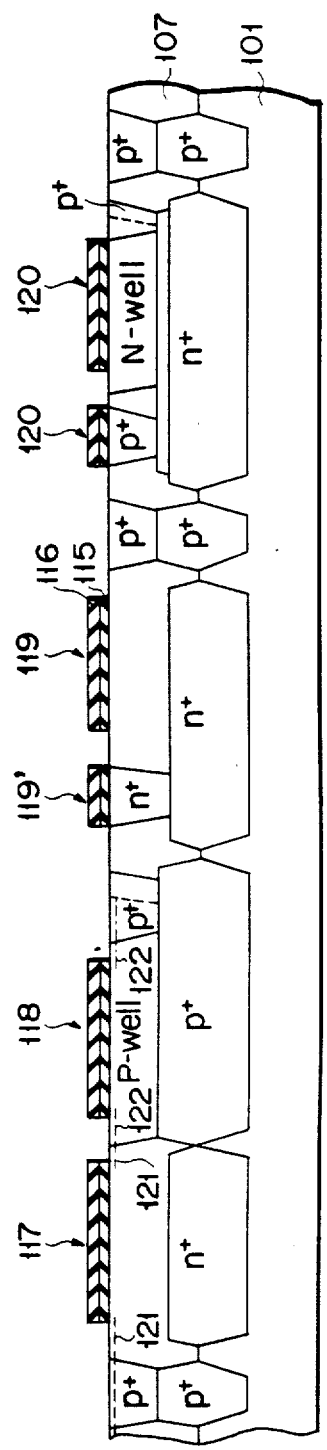

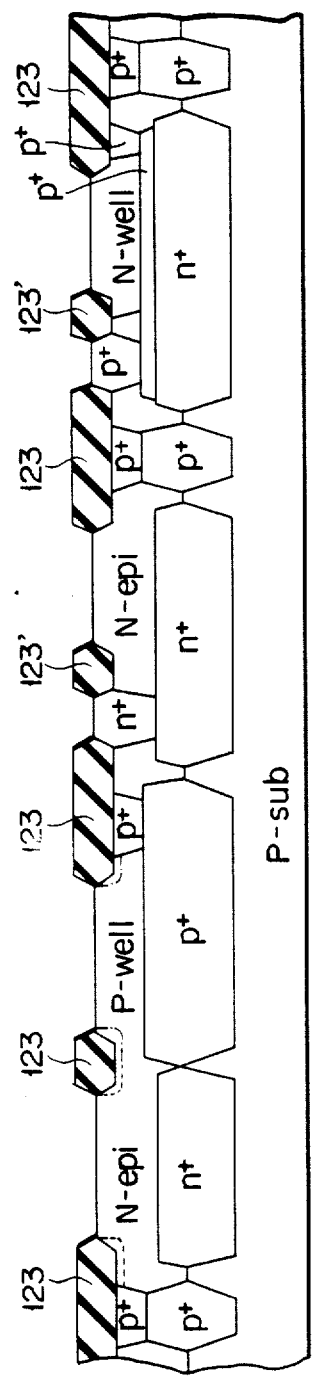
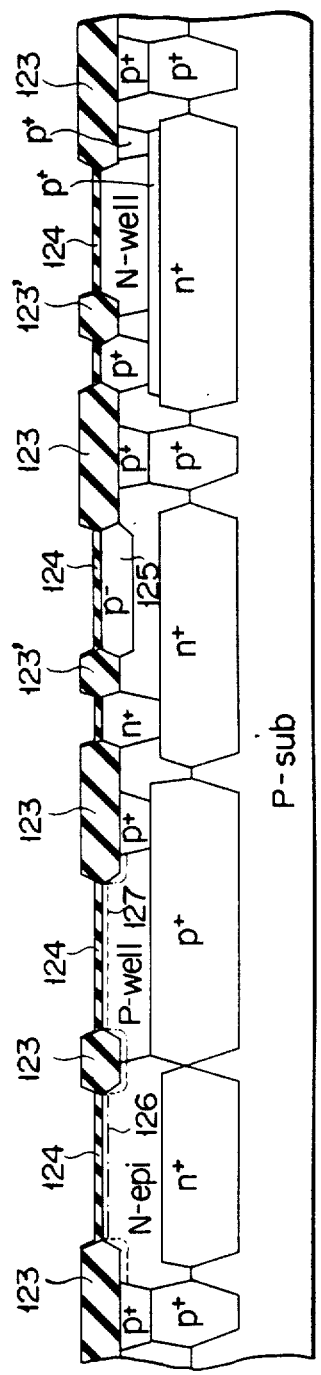

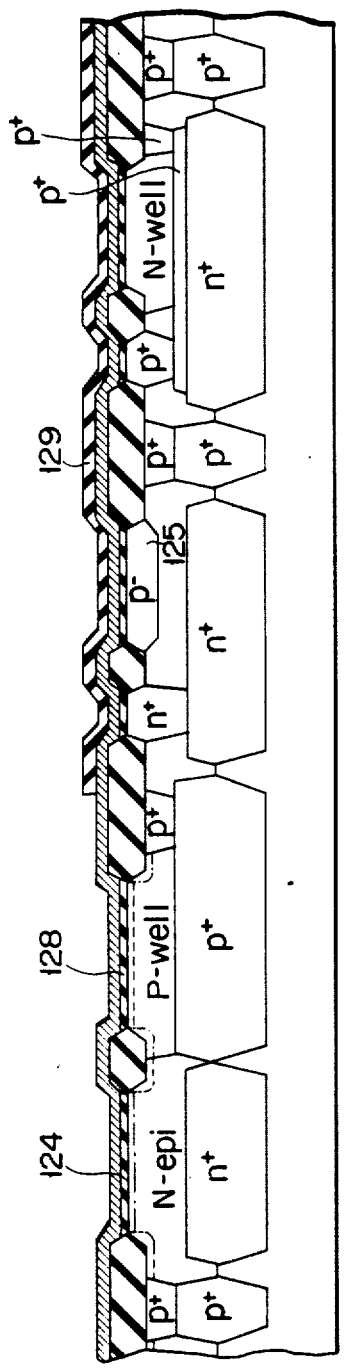
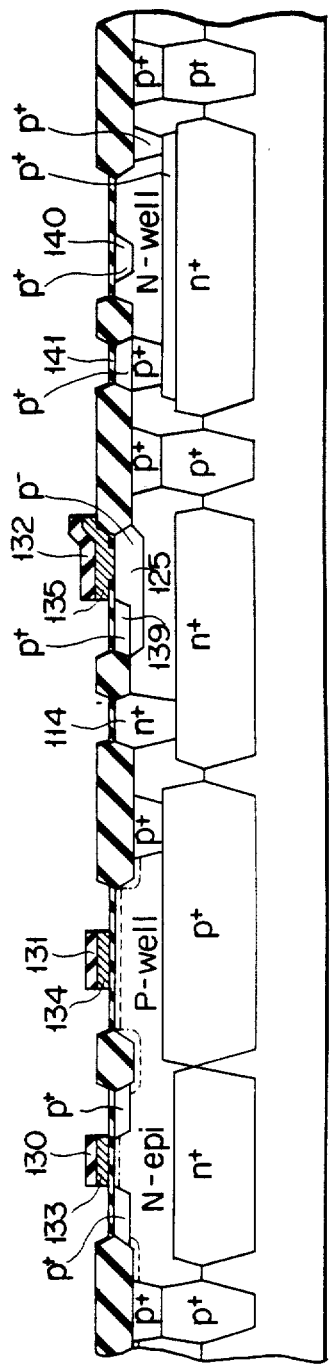
FIG. 4I
FIG. 4J

4,694,562

METHOD FOR MANUFACTURING A SEMICONDUCTOR INTEGRATED DEVICE INCLUDING BIPOLAR AND CMOS TRANSISTORS

This is a continuation of application Ser. No. 847,150 filed Apr. 3, 1986 now U.S. Pat. No. 4,637,125, which is a continuation of application Ser. No. 652,087 filed Sept. 19, 1984, now abandoned.

BACKGROUND OF THE INVENTION

1. Field of the Invention

The present invention relates to a semiconductor integrated device and, more particularly, to a semiconductor device comprising a bipolar transistor and a complementary MOS transistor formed on a single semiconductor substrate, and to a manfacturing method thereof.

A semiconductor integrated device wherein both a bipolar transistor and a complementary MOS transistor are formed on a single semiconductor substrate is generally called a Bi-CMOS. The Bi-CMOS is a relatively new semiconductor integrated device (IC) and was developed so as to meet the demand for an IC including both analog and digital functions in a single semiconductor chip. An IC having both analog and digital functions can consist of an Integrated Injection Logic (I²L) or a CMOS. However, in a Bi-CMOS, analog processing is performed by a bipolar element which is suitable therefor, and digital processing is performed by a CMOS element which is suitable therefor, so that the Bi-CMOS can have features of both the bipolar and CMOS elements. Therefore, the Bi-CMOS is expected to extend the application fields of an analog/digital IC.

Needless to say, the Bi-CMOS has its own problem, i.e., a latch up phenomenon which is characteristic to the CMOS structure. However, in order to prevent this latch up phenomenon of the Bi-CMOS, not only the CMOS part but also the whole structure of the Bi-CMOS must be considered. In this respect, the Bi-CMOS shown in FIG. 1, which is available for preventing the latch up phenomenon and in which both a bipolar transistor having a large current drive capacity and a CMOS are formed on a single substrate, is suggested (IBM Technical Disclosure Bulletin; vol. 16, No. 18, 1974, pp. 2,719 to 2,720).

In FIG. 1, reference numeral 1 denotes a p-type silicon substrate. A p-type epitaxial silicon layer 2 is formed on the p-type silicon substrate 1. Two high concentration n+-type buried layers 3a and 3b are partially buried in both the substrate 1 and the epitaxial layer 2. N-type well regions 4a and 4b (referred as n-wells hereafter) are formed extending downward from the surface of the epitaxial layer 2 to the surfaces of the n+-type buried layers 3a and 3b, respectively. The n-well 4b serves as an element region of a bipolar transistor; a vertical npn transistor 30 is formed as shown in FIG. 1. The npn transistor 30 is electrically isolated from the other elements by a p-n junction with a p-type region surrounding it. The other n-well 4a and the p-type epitaxial layer 2 adjacent thereto serve as an element region of a CMOS. Then, an n-channel MOS transistor (n-MOSFET) 20 and a p-channel MOS transistor (p-MOSFET) 10 are respectively formed in the n-well 4a and the p-type epitaxial layer 2. Reference numeral 5 denotes a silicon oxide film.

In the Bi-CMOS structure of FIG. 1, the n+-type buried layer 3a is formed under the n-well 4a. Therefore, of parasitic transistors causing the latch up phenomenon in the CMOS part, a vertical parasitic pnp transistor formed in the n-MOSFET 20 has a small $h_{FE}$ and is, therefore, available for preventing the latch up phenomenon. However, the operations of a lateral parasitic pnp and npn transistors in the CMOS part cannot be prevented. Furthermore, the presence of the n+-type buried layers 3a and 3b results in an easy operation of the lateral parasitic npn transistor consisting of the n-wells 4a and 4b and the p-type region therebetween, and this parasitic transistor is inherent to the Bi-CMOS.

As described above, the structure of FIG. 1 cannot completely prevent the latch up phenomenon.

In this manner, a Bi-CMOS, which is regarded as being able to prevent the latch up phenomenon and in which both a CMOS and a bipolar transistor are formed, is known; though it is not sufficient as described above. However, a Bi-CMOS (referred as CBi-CMOS hereafter) in which complementary bipolar transistors are used as a bipolar transistor is not yet known. The Bi-CMOS without complementary bipolar transistors generally has the following defects.

When a power supply voltage is low, an open gain of an operational amplifier (Ope-Amp) is also low and it is difficult to obtain a wide frequency range. In addition, when a power supply voltage is low, it is also difficult to provide a wide dynamic range. Furthermore, it is difficult to constitute an output stage having a large current flow, a large output and, in this case, a high speed.

In this manner, a strong demand has arisen for a CBi-CMOS in which both a complementary bipolar transistor and a CMOS are formed.

SUMMARY OF THE INVENTION

It is the first object of the present invention to provide a semiconductor integrated circuit device (Bi-CMOS) for forming both a bipolar transistor and a CMOS on a single semiconductor substrate, and for completely preventing a latch up phenomenon caused by including the CMOS.

It is the second object of the present invention to provide a semiconductor integrated circuit device (CBi-CMOS) for forming both a complementary bipolar transistor and a CMOS on a single semiconductor substrate, and for completely preventing the latch up phenomenon caused by including the CMOS.

It is the third object of the present invention to provide a suitable manufacturing method for obtaining a CBi-CMOS of the type described above.

Other objects of the present invention will be apparent from the following detailed description.

A semiconductor integrated circuit device of the first object of the present invention comprises:
a semiconductor substrate of a first conductivity type;
a semiconductor layer of a second conductivity type deposited on said semiconductor substrate;
a first high concentration buried region of the second conductivity type for a vertical bipolar transistor which is selectively buried both in said semiconductor layer and said semiconductor substrate;
a second high concentration buried region of the first conductivity type selectively buried both in said semiconductor substrate and said semiconductor layer so as to surround said first high concentration buried region;

a first electrical isolation region selectively formed to extend downward from a main surface of said semiconductor layer to said second high concentration buried region of the first conductivity type;

said vertical bipolar transistor being formed to have as a collector region thereof a region of said semiconductor layer surrounded by said first electrical isolation region;

third and fourth high concentration buried regions of the first and second conductivity types, respectively, for second and first conductivity type channel MOS transistors which are selectively formed in said semiconductor layer and said semiconductor substrate outside said first electrical isolation region; and a well region of the first conductivity type selectively formed to extend downward from the main surface of said semiconductor layer to said third high concentration buried region;

said second conductivity type channel MOS transistor being formed in said well region; and said first conductivity type channel MOS transistor being formed in said semiconductor layer which is formed on said fourth high concentration buried region.

A semiconductor integrated circuit device (CBi-CMOS) of the second object of the present invention comprises the following elements in addition to said Bi-CMOS:

a fifth high concentration buried region of the second conductivity type for another vertical bipolar transistor which is selectively buried both in a said semiconductor substrate and said semiconductor layer;

a sixth high concentration buried region of the first conductivity type selectively formed in said semiconductor substrate and said semiconductor layer so as to surround said fifth high concentration buried region;

another first electrical isolation region being selectively formed to extend downward from the main surface of said semiconductor layer to said sixth high concentration buried region;

a seventh high concentration buried region of the first conductivity type formed in a portion between a region of said semiconductor layer which is surrounded by said another first electrical isolation region and said sixth high concentration buried region; and a second electrical isolation region formed to extend downward from the main surface of said semiconductor layer to said seventh high concentration buried region and provided to surround a part of the region of said semiconductor layer enclosed by said another first electrical isolation region;

said another vertical bipolar transistor being formed to have as a base region thereof said region of said semiconductor layer which is surrounded by said second electrical isolation region.

When a p-type semiconductor substrate is used, for example, a Bi-CMOS and a CBi-CMOS respectively have the structures schematically shown in FIGS. 2 and 3. First, the Bi-CMOS of FIG. 2 will be described.

Referring to FIG. 2, reference numeral 1 denotes a p-type substrate, and 2' denotes an n-type layer. An n+-type buried region 3b for a bipolar transistor and another n+-type buried region 3a are formed to be partially buried both in the p-type substrate 1 and the n-type layer 2'. Furthermore, a p+-type buried region 6b, which surrounds the n+-type buried region 3b and another p+-type buried region 6a which is outside the buried region 6b, are formed. A p+-type isolation region 7 is formed to extend downward from the surface of the n-type layer 2' to the p+-type buried region 6b. A vertical npn transistor 30 is formed in a portion of the n-type layer 2' surrounded by the p+-type isolation region 7. On the other hand, a P-well 4' is formed to extend downward from the surface of the n-type layer 2' to the p+-type buried region 6a. Then, an n-MOSFET 10 is formed in the P-well 4'. Finally, a p-MOSFET 20 is formed in a portion of the n-type layer 2' which is on the n+-type buried region 3a.

Next, the CBi-CMOS of FIG. 3 will be described. As is apparent from FIG. 3, an n-MOSFET 10, a p-MOSFET 20 and a vertical npn transistor 30 are the same as those in FIG. 2. However, the structure of FIG. 3 is different from that of FIG. 2 in the respect that a vertical pnp transistor 40 is formed in addition thereto. Therefore, an n+-type buried region 3c for a bipolar transistor and a surrounding p+-type buried region 6b are formed to be buried both in the p-type substrate 1 and the n-type layer 2'. A p+-type isolation region 7 is formed extending downward from the surface of the n-type layer 2' to the p+-type buried region 6b so as to achieve the electrical isolation of the vertical pnp transistor 40. A p+-type buried region 8 is formed in a portion of the n-type layer 2' surrounded by the p+-type isolation region 7 and the n+-type buried region 3c. A p+-type isolation region 9 is selectively formed extending downward from the surface of the n-type layer 2' to the p+-type buried region 8. Then, the vertical pnp transistor 40 is constituted by using the portion of the n-type layer 2' surrounded by the p+-type isolation region 9 as a base region and by using the underlying p+-type buried region 8 as a collector region.

As is apparent from the comparison of the structures of FIGS. 2 and 3 and that of FIG. 1, both a Bi-CMOS and a CBi-CMOS of the present invention have the high concentration buried regions 6a and 3a formed in the MOSFETs 10 and 20, respectively (In FIG. 1, only P-MOSFET 20 has a high concentration buried region 3a). In order to isolated the npn vertical bipolar transistor 30 from other elements, the p+-type regions 6b and 7 are formed. Therefore, the p+-type buried region 6b always exists between the n+-type buried regions 3a and 3b (and 3c). As will be described later, these features enable the Bi-CMOS and the CBi-CMOS of the present invention to completely prevent the latch up phenomenon. Furthermore, in the CBi-CMOS of FIG. 3, the pnp vertical bipolar transistor 40 which is not formed in FIG. 1 is formed in good alignment with other elements 10, 20 and 30. Accordingly, the CBi-CMOS of the present invention can meet the demand for a device including both complementary bipolar transistors and a CMOS.

Since the p+-type isolation regions 7 and 9 of FIGS. 2 and 3 are formed in order to isolate semiconductor layer portions located on both their sides, these p+-type isolation regions may replace dielectric layers such as oxide film layers. For example, an isoplaner structure, which is used in element isolation, may be employed.

On the other hand, as described later, the positions of the n- and p-MOSFETs 10 and 20 may be exchanged in FIGS. 2 and 3, and the p+-type buried region 6a may serve as an isolation region replacing the portion of the p+-type buried region 6b. In this case, a portion of the p+-type isolation region 7 is formed in the P-well 4' and may serve as a contact region thereof.

Since an n-type region surrounded by the p+-type isolation region 9 serves as a base region of the pnp bipolar transistor 40, it is preferable that the region is formed as an n-well so as to control the impurity concentration thereof.

Next, a manufacturing method of a CBi-CMOS of the third object of the present invention will be described. The manufacturing method of a CBi-CMOS comprises the steps of:

- selectively doping an impurity of a second conductivity type on a main surface of a semiconductor substrate of a first conductivity type, so as to form first and second high concentration buried regions of the second conductivity type for bipolar transistors and a third high concentration buried region of the second conductivity type for an MOS transistor;
- selectively doping an impurity of the first conductivity type having a larger diffusion coefficient than that of said impurity of second conductivity type in said semiconductor substrate, so as to form fourth high concentration buried regions of the first conductivity type so as to respectively surround said first and second high concentration buried regions for the bipolar transistors and a fifth high concentration buried region of the first conductivity type for the MOS transistor, and simultaneously doping said impurity of the first conductivity type on said first high concentration buried regions;
- epitaxially growing a semiconductor layer of the second conductivity type on a surface of said semiconductor substrate in which high concentration buried regions are formed, auto-doping said impurity of the first conductivity type which is doped in said first high concentration buried regions, and forming a sixth high concentration buried regions of the first conductivity type to be in contact with a surface of said first high concentration buried region;
- selectively diffusing an impurity of the first conductivity type from a main surface of said semiconductor layer so as to form a well region of the first conductivity type to reach said fifth high concentration buried region;
- selectively performing high-concentration diffusion of an impurity of the first conductivity type from the main surface of said semiconductor layer or selectively converting said semiconductor layer into an insulating layer, so as to form a first electrical isolation region reaching said fourth high concentration buried regions which are formed so as to respectively surround said first and second high concentration buried regions;
- selectively performing high-concentration diffusion of an impurity of the first conductivity type from the main surface of said semiconductor layer or selectively converting said semiconductor layer into a insulating layer, so as to form second electrical isolation region reaching said sixth high concentration buried regions, the second electrical isolation region enclosing a part of said semiconductor layer of the second conductivity type; and
- forming two vertical bipolar transistors and MOS transistors of first and second conductivity types; said bipolar transistors being formed in the semiconductor region of the second conductivity type surrounded by said first electrical isolation region, one, which includes said semiconductor region as the collector region, in that part of said semiconductor region in which said sixth high concentration buried region is not formed, and the other, which includes said sixth high concentration buried region as the collector, in the other part of said semiconductor region; the MOS transistor of the second conductivity type channel being formed in said first well region of the first conductivity type; and the MOS transistor of the first conductivity type channel being formed on the semiconductor region of the second conductivity type positioned above said third high concentration buried region.

For example, when a manufacturing method of the present invention is performed using a p-type substrate, the structure of FIG. 3 can be obtained. In this case, when the first and second p+-type isolation regions 7 and 9 or the P-well 4' are formed, since the p+-type buried regions 6a and 6b have already been formed, the impurity diffusion process for forming the isolation region 7 and the P-well 4' can be performed at a low temperature and within a short period of time in comparison with that when the regions 6a and 6b are not formed. Therefore, outward diffusion of an impurity from the high concentration buried regions 3a, 3b, 3c and 6a under corresponding element regions to the n-type layer 2' can be controlled at a low level. Thus the impurity concentration in respective element regions of the transistors 10, 20, 30 and 40 can be stably controlled. As a result, a CBi-CMOS, including both complementary vertical bipolar transistors of high-performance and a CMOS having stable characteristics, can be obtained.

BRIEF DESCRIPTION OF THE DRAWINGS

FIG. 3 is a schematic sectional view of a CBi-CMOS of the present invention;

FIGS. 4A to 4M are sectional views for sequentially explaining a manufacturing process of a Bi-CMOS of an embodiment of the present invention;

DETAILED DESCRIPTION OF THE PREFERRED EMBODIMENTS

Embodiments of the present invention will now be described with reference to FIGS. 4A to 4M, 5 and 6.

Figure 1:
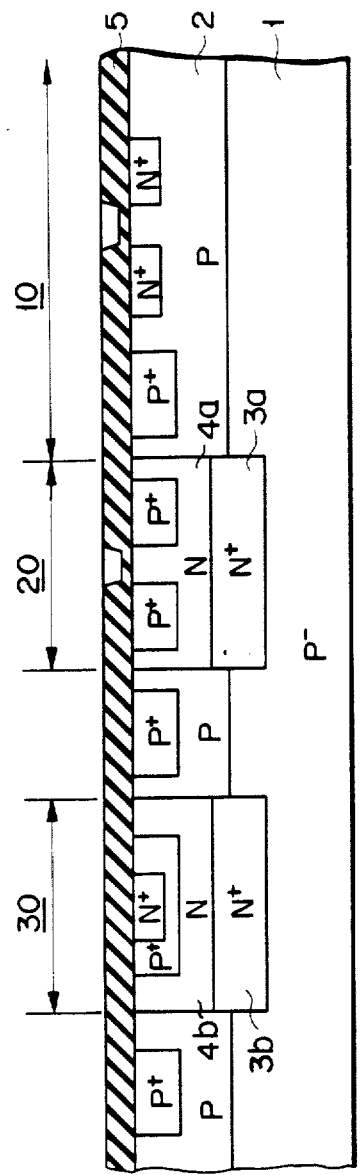
FIG. 1 is a sectional view of a conventional Bi-CMOS.
Figure 2:
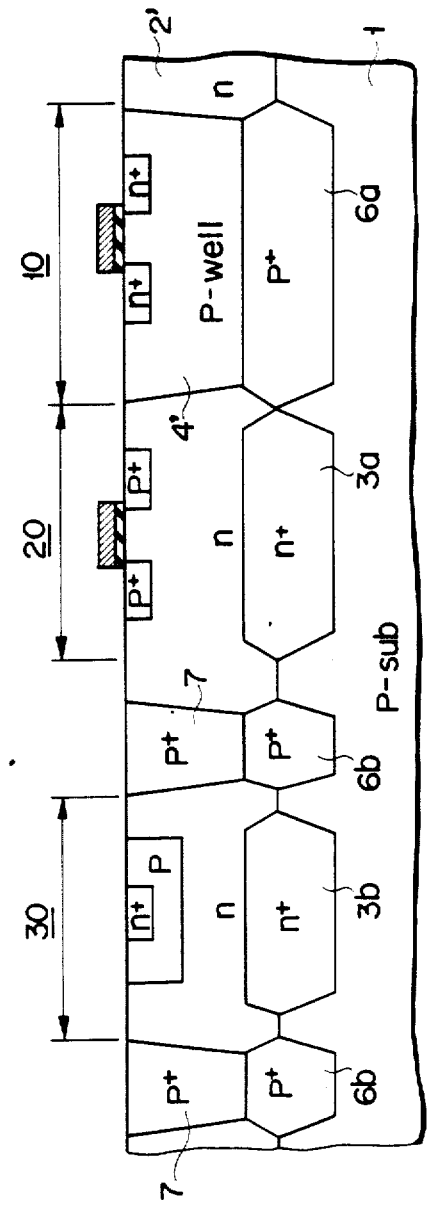
FIG. 2 is a schematic sectional view of a Bi-CMOS of the present invention.

Note that these embodiments relate to a CBi-CMOS and a manufacturing method thereof. However, as apparent from the description of FIGS. 2 and 3, a CBi-CMOS includes a Bi-CMOS. In this respect, it should be recognized that embodiments described hereafter include that of a Bi-CMOS.

EXAMPLE 1 (FIGS. 4A TO 4M)

(I) An insulating film serving as a diffusion mask such as a thermal oxide film is formed on a low concentration p-type substrate 101 having an impurity concentration of $10^{14}$ to $10^{15}$ atom/cm$^3$. Then, the thermal oxide film is patterned, thereby forming a thermal oxide film pattern 102 having openings corresponding to n+-type buried regions to be formed later. Then, an n-type impurity such as Sb or As is selectively thermally-diffused using the thermal oxide film pattern 102 as a mask so as to form an n+-type buried regions 103a for a MOS transistor and two n+-type buried regions 103b and 103c for a bipolar transistor. Since this thermal diffusion process is generally performed in an oxidizing atmosphere, corresponding surfaces of the n+-type buried regions 103a, 103b and 103c are covered by a thermal oxide film 104 formed during this process (FIG. 4A).

Figure 4B:
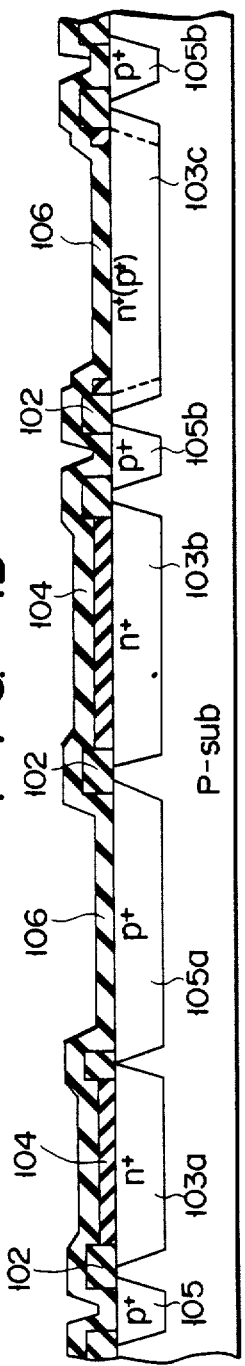

(II) Subsequently, the thermal oxide film pattern 102 is patterned again to form a thermal oxide film pattern 102' having openings corresponding to a p+-type buried region to be formed later, and a portion of the thermal oxide film 104 which covers the n+-type buried region 103c is selectively removed. Then, a p-type impurity such as boron is selectively diffused using the thermal oxide films 104 and 102' as a mask, thereby forming a p+-type buried region 105b surrounding the n+-type buried regions 103b and 103c for the bipolar transistors and a p+-type buried region 105a for the MOS transistor. Simultaneously, the same p-type impurity is doped in the n+-type buried region 103c (FIG. 4B).

Note that the n+-type buried region 103c is surrounded only by the p+-type buried region 105b, and the n+-type buried region 103b is completely surrounded by both the p+-type buried regions 105a and 105b.

For example, the p+-type buried regions 105a and 105b respectively having an impurity concentration of about $10^{17}$ to $10^{19}/cm^3$ are formed by thermal diffusion of boron from a boron-containing silica glass (e.g., BSG) film 106, or ion-implantation of boron.

Figure 4C:
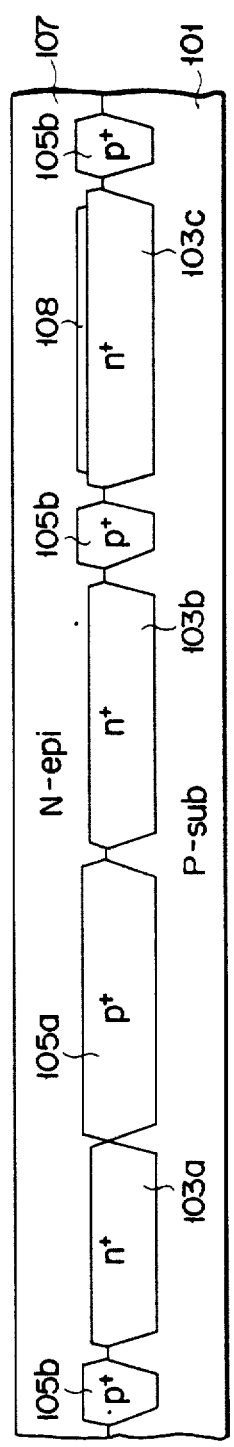

(III) Next, the oxide films 104 and 102' and the BSG film 106 on the silicon substrate 101 are all removed, and then an n-type epitaxial silicon layer 107 is grown (FIG. 4C).

Note that the n-type epitaxial silicon layer 107 has a thickness of 1 to 5 μm, and a resistivity of about 1 to 5 Ω.cm. However, these parameters are merely set up as a reference and may be varied according to various conditions.

During the epitaxial growth, the impurities are diffused into the epitaxial layer 107 from the corresponding high concentration buried regions 103a, 103b, 103c, 105a and 105b. In particular, from the n+-type buried region 103c, not only an n-type impurity, but another p-type impurity, which was doped after the n-type impurity, is also diffused, and since the p-type impurity has a larger diffusion coefficient than that of the n-type impurity, a p+-type buried region 108 is formed on the n+-type buried region 103c in contact therewith.

A p-MOSFET and an n-MOSFET are respectively formed on the n+-type and p+-type buried regions 103a and 105a, and a vertical npn transistor and a vertical pnp transistor are respectively formed on the n+-type buried regions 103b and 103c.

(IV) A p-well for the n-MOSFET and an n-well serving as a base region of the vertical pnp transistor are formed, for example, in the following manner. Accordingly, a thermal oxide film 109 with a thickness of about 1,000 Å is formed on a surface of the epitaxial silicon layer 107, and thereafter boron is ion-implanted using the thermal oxide film 109 as a buffer film so as to form a diffusion source for forming a p-well. The conditions of ion-implantation are preferably set at an accelerating voltage of 150 KeV, and a dose of 1 to $5 \times 10^{12}/cm^2$.

Figure 4D:
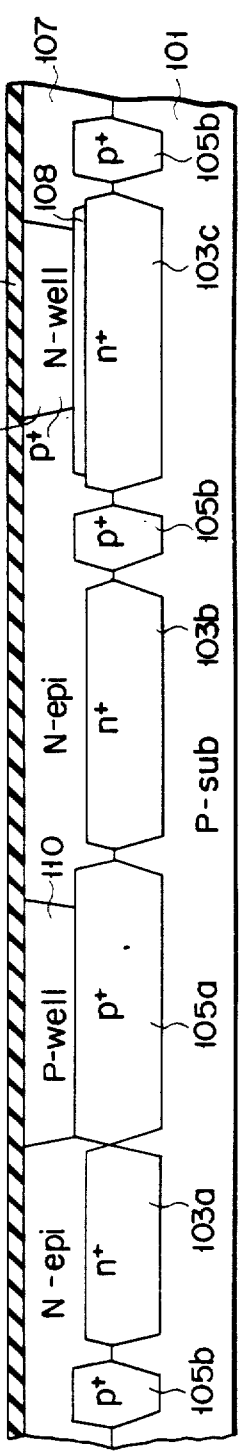

The diffusion source is slumped at a high temperature of 1,100° to 1,200° C. to form a p-well 110. Subsequently, phosphorus is ion-implanted and thermally diffused to form an n-well 111 (FIG. 4D).

Note that in a single annealing process, both the P- and n-wells 110 and 111 can be formed.

(V) High concentration diffusion of boron is selectively performed to form first p+-type isolation regions 112a and 112b, which are necessary for electrically isolating the bipolar transistors parts from other elements and respectively reaching the p+-type buried regions 105a and 105b. Simultaneously, a second p+-type isolation region 113, which surrounds the n-well 111 in contact with a portion thereof and reaches the p+-type buried region 108, is formed. These first and second p+-type isolation regions 112a, 112b and 113 are formed to have a surface concentration of about $10^{18}$ to $10^{20}/cm^3$. High concentration diffusion of phosphorus is performed, thereby forming a collector contact region 114 which reaches the n+-type buried region 103b (FIG. 4E).

In this embodiment, the first p+-type isolation region 112a also serves as an contact region of the p-well 110. The second p+-type isolation region 113 isolates the vertical pnp transistor from other elements and serves as a collector contact region thereof.

Furthermore, an n+-type diffusion region (not shown) which serves as an contact region and reaches the n+-type buried region 103a is simultaneously formed when the collector contact region 114 is formed.

(VI) A thermal oxide film 115 and an anti-oxidizing film such as a CVD-silicon nitride film 116 are sequentially deposited on the surface of the epitaxial silicon layer 107. Thereafter, these multilayer films are patterned to form a multilayer pattern 117 covering a p-MOSFET element region, a multilayer pattern 118 covering an n-MOSFET element region, multilayer patterns 119 and 119' covering a vertical npn transistor element region, and multilayer patterns 120 and 120' covering a vertical pnp transistor element region. Subsequently, channel cut regions 121 and 122 for preventing inversion are formed in a portion to be respective field regions of CMOSs, if desired (FIG. 4F).

In this case, an n-type impurity such as phosphorus is ion-implanted using the multilayer pattern 117 as a mask to form the channel cut region 121 of the p-MOSFET. A p-type impurity such as boron is ion-implanted using the multilayer pattern 118 as a mask to form the channel cut region 122 of the n-MOSFET. This ion-implantation for respective MOSFET parts is performed alternately. Therefore, one MOSFET part is ion-implanted, while the other one and complementary bipolar transistor parts are masked by, e.g., a resist pattern film.

(VII) The epitaxial layer 107 is selectively oxidized using the multilayer patterns 117, 118, 119, 119', 120 and 120' and the silicon nitride film 116 as an anti-oxidizing mask. A field oxide film 123 for element isolation and an isolation oxide film 123' are formed to have a thickness of about 0.7 to 1.0 μm, respectively (FIG. 4G).

It is preferable that selective oxidation is performed at a low temperature of 900° to 1,000° C. In this case, if the atmospheric pressure is increased, the oxidation time can be shortened.

Figure 5:
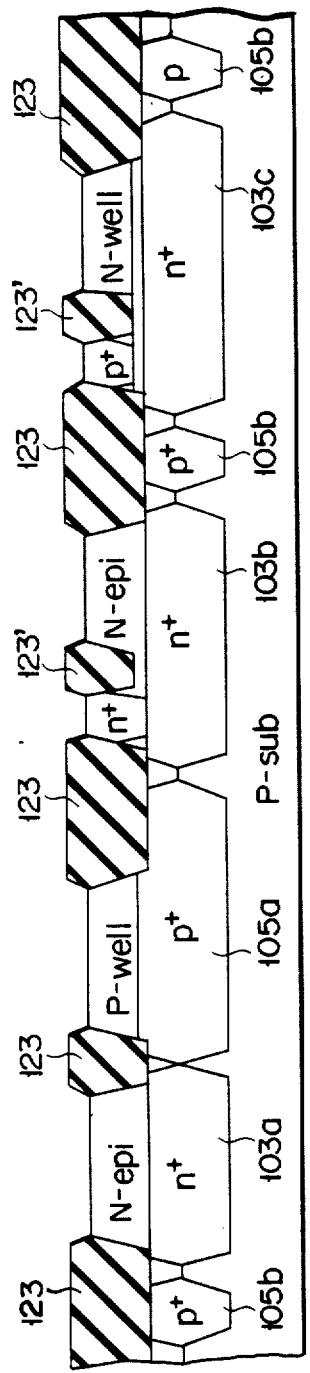
FIG. 5 is a view of another element isolation according to the present invention.

In addition, when the epitaxial layer 107 is relatively thin, the first p+-type isolation regions 112a and 112b and the second p+-type isolation region 113 can be omitted. In this case, the field oxide film 123 and the isolation oxide film 123' are deeply formed to reach the corresponding buried regions, whereby dielectric isolation can be performed (as seen in FIG. 5). Alternatively, when the epitaxial layer 107 is thick, a field portion of the silicon substrate 101 is selectively etched before field oxidation, and then is thermally oxidized to form a so-called isoplaner structure (buried field oxide film structure), thereby achieving the same dielectric isolation as that with a field oxide film or the like. According to this isoplaner structure, a surface of a semiconductor layer can be flattened, and thus problems associated with poor step coverage of a metal wiring can be satisfactorily prevented. In a dielectric isolation structure described above, since the high concentration isolation regions 103a and 105a are formed to be in contact with a lower surface of the field oxide film, the latch up phenomenon in CMOS parts can be prevented even if the channel cut regions 117 and 118 for preventing inversion are omitted.

(VIII) Next, the exposed surface of each element region is thermally oxidized to form a thermal oxide film 124 to be a gate oxide film of each CMOS. Then, a p+-type active base region 125 of the vertical npn transistor is formed, and ion-implantations 126 and 127 for controlling a threshold voltage are performed with respect to respective element regions of the p- and n-MOSFETs, if desired (FIG. 4H).

In the process of forming the active base region 125, boron is ion-implanted using the field oxide film 123 and the isolation oxide film 123' as a blocking mask so as to form a diffusion source, and thereafter, the diffusion source is annealed at a temperature of about 1,000° C. so as to form the base region 125 by self-alignment. In this case, when the conditions for ion-implantation satisfy, e.g., a dose of 5 to $5.5 \times 10^{13}/cm^2$ and an accelerating voltage of 40 KeV, a sheet resistance of 1 K$\Omega$/$\Box$ can be obtained. In the case when the ion-implantations 126 and 127 are performed, one of p- and n-type impurities is used for each, or both the p- and n-type impurities are diffused in every MOSFET selectively along the direction of depth. According to how and which type of ions are implanted, a depletion type (D-type) MOS transistor of a buried channel MOS transistor can be formed, wherein a threshold voltage (Vth) is easily controlled.

(IX) As shown in FIG. 4I, an emitter diffusion window is formed in an element region of the vertical npn transistor which covers the active base region 125. Thereafter, a polycrystalline silicon layer in which no impurity is doped is deposited on the entire surface of the resultant structure by a CVD method to a thickness of about 2,500 to 4,000 Å.

Subsequently, an n-type impurity having a predetermined concentration is doped in the polycrystalline silicon layer so as to form an n+-type polycrystalline silicon layer 128. The n+-type polycrystalline silicon layer 128 is used for forming a gate electrode of the CMOS and an emitter electrode of the vertical npn transistor. In this case, in the n+-type polycrystalline silicon layer 128, the impurity concentration of the gate region of the CMOS is preferably different from that of the emitter region of the vertical npn transistor. For example, the structure and characteristics of the device are improved when the gate region of the CMOS has a sheet resistance of 30 $\Omega$/$\Box$ or less, and the emitter region of the npn transistor has a sheet resistance of about 150 $\Omega$/$\Box$. In order to realize this, with respect to the emitter region of the npn transistor, arsenic is used as an impurity which is doped in the polycrystalline silicon layer 128, and with respect to the gate region of the CMOS, phosphorus is used. Then, impurity doping can be performed in the following manner.

First, a CVD-SiO$_2$ film of a thickness of about 5,000 Å is deposited to cover the entire surface of the undoped polycrystalline silicon layer 128. Thereafter, the CVD-SiO$_2$ film is patterned to form a CVD-SiO$_2$ film pattern 129 having openings at the CMOS parts, as shown in FIG. 4I. Then, in an atmosphere including phosphorus in a furnace tube, phosphorus is doped in the undoped polycrystalline silicon 128 to have a high concentration at a high temperature of 900° to 1,000° C. In this case, phosphorus preferably has a concentration of about $1 \times 10^{21}$ atom/cm$^3$. Subsequently, the residual CVD-SiO$_2$ film pattern 129 is removed and arsenic is ion-implanted in the entire surface of the resultant structure. Another SiO$_2$ film or a multilayer formed of an SiO$_2$ film and a silicon nitride film are deposited by a CVD method to cover the entire surface of the polycrystalline silicon layer. Thereafter, the ion-implanted arsenic is annealed at a temperature of 900° to 950° C., thereby forming the n+-type polycrystalline silicon layer 128 in which arsenic is evenly distributed.

If ion-implantation at a dose of 5 to $10 \times 10^{15}/cm^2$ is performed, the emitter electrode region of the vertical npn transistor can have an impurity concentration of about $3 \times 10^{20}$ atom/cm$^3$.

(X) Next, the SiO$_2$ film of the multilayer formed of a SiO$_2$ film and a silicon nitride film (neither are shown) is patterned to form insulating film patterns 130 and 131 which cover the respective gate regions of the CMOSs, and an insulating film pattern 132 which covers the emitter region of the npn bipolar transistor. Subsequently, the layer 128 is selectively patterned using these insulating film patterns 130, 131 and 132 as a mask, whereby polycrystalline silicon wiring layers such as a gate electrode 133 of the p-MOSFET, a gate electrode 134 of the n-MOSFET, an emitter electrode 135 of the npn biporlar transistor and the like are formed. Furthermore, boron is selectively doped using the insulating film patterns 130 and 132 as a mask so as to form a source 138 and a drain and 138' of the p-MOSFET, a p+-type external base region 139 of the vertical npn transistor, an a p+-type emitter region 140 and a p+-type collector contact region 141 of the vertical pnp transistor (FIG. 4J).

Before boron is selectively doped, the n-MOSFET portion and the collector electrode region 114 of the npn transistor are masked by, e.g., a resist pattern, and the n-well 111 is also masked by a resist pattern having an opening above a prospective region of the p+-type emitter region 140. Then, ion-implantation with boron of a concentration of 1 to $3 \times 10^{15}/cm^3$ is performed. In this case, the field oxide film 123, the gate electrode 133, the isolation oxide film 123' and the emitter electrode 135 serve as a blocking mask, and thus boron is selectively doped in self-alignment in predetermined regions except for a region to be the p+-type emitter region 140 of the vertical pnp transistor.

Figure 4K:
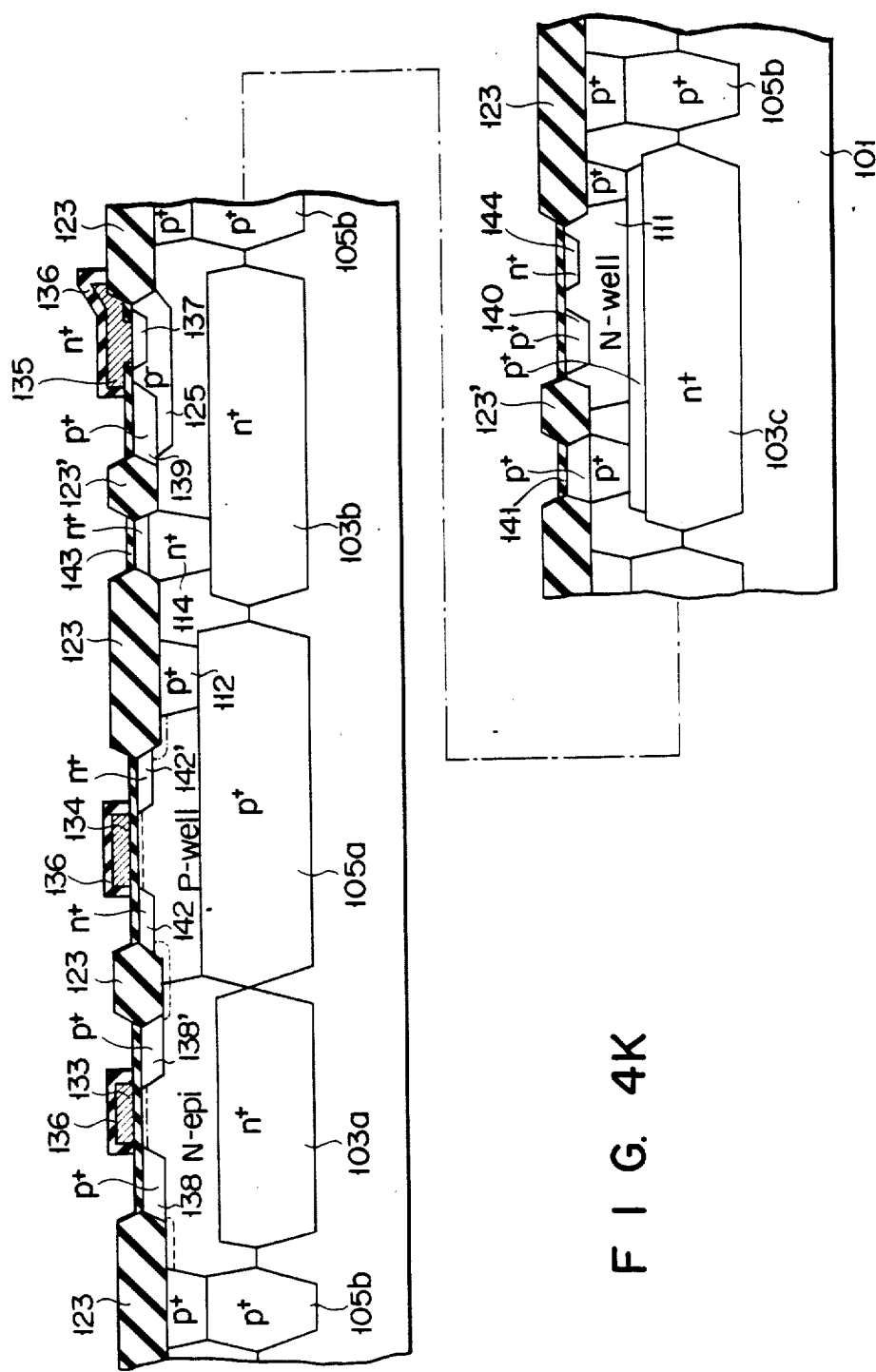

(XI) Then, the insulating film patterns 130, 131 and 132 are removed and the resultant structure is heated to form thermal oxide films 136 in respective surface regions of the electrodes 133, 134, 135, and the like. By this annealing, arsenic is doped from the emitter electrode 135 to the active base region 125 to form an n+-type emitter region 137. Subsequently, arsenic is selectively doped, thereby forming n+-type source and drain regions 142 and 142' of the n-MOSFET, and an n+-type collector contact region 143 of the vertical npn transistor, and an n+-type external base region (base contact region) 144 of the vertical pnp transistor (FIG. 4K).

Before arsenic is selectively doped, the p-MOSFET part and the active base region 125 of the npn transistor are masked by, e.g., a resist pattern, and the vertical npn transistor portion is also masked by a resist pattern having an opening above a prospective region of the n+-type external base region 144. Then, ion-implantation of arsenic of a concentration of 1 to $3 \times 10^{15}/cm^3$ is performed. In this case, since the field oxide film 123, the thermal oxide film 136, and the isolation oxide film 123' also serve as a blocking mask, arsenic is selectively doped in self-alignment in predetermined regions except for a region to be the external base region 144 of the vertical pnp transistor.

After the ion-implantation of arsenic, the resultant structure is annealed at a high temperature of 900° to 1,000° C., thereby forming the predetermined n+-type impurity regions 142, 142', 143 and 144.

Figure 4L:
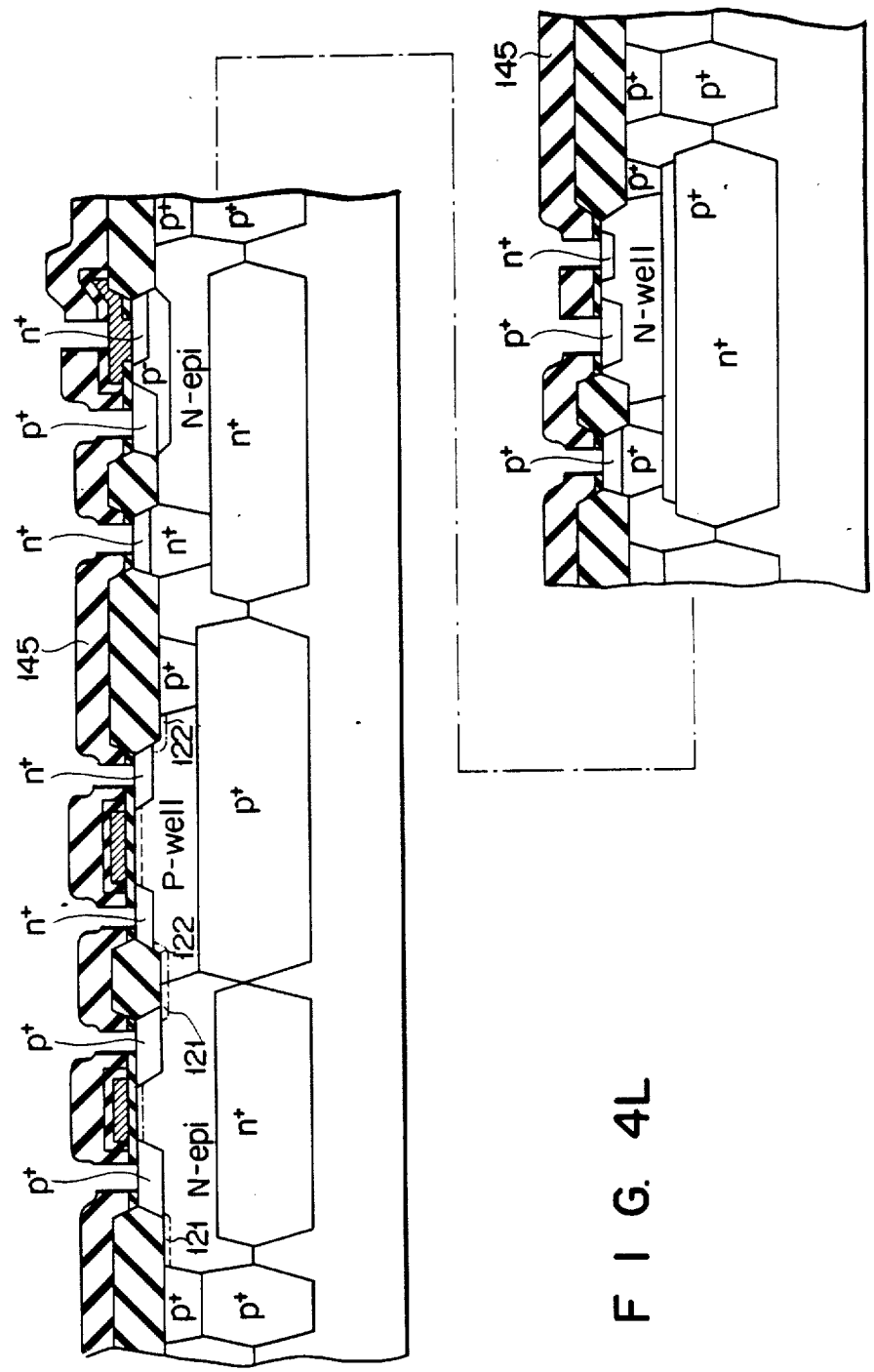

(XII) A passivation film 145 formed of phosphorus-doped $SiO_2$ (PSG), boron-doped $SiO_2$ (BSG), or the like is deposited by a CVD method on the entire surface of the resultant structure. Thereafter, selective etching is performed to form respective contact holes for forming aluminum electrodes of the CMOSs and the complementary vertical bipolar transistors (FIG. 4L).

Figure 4M:
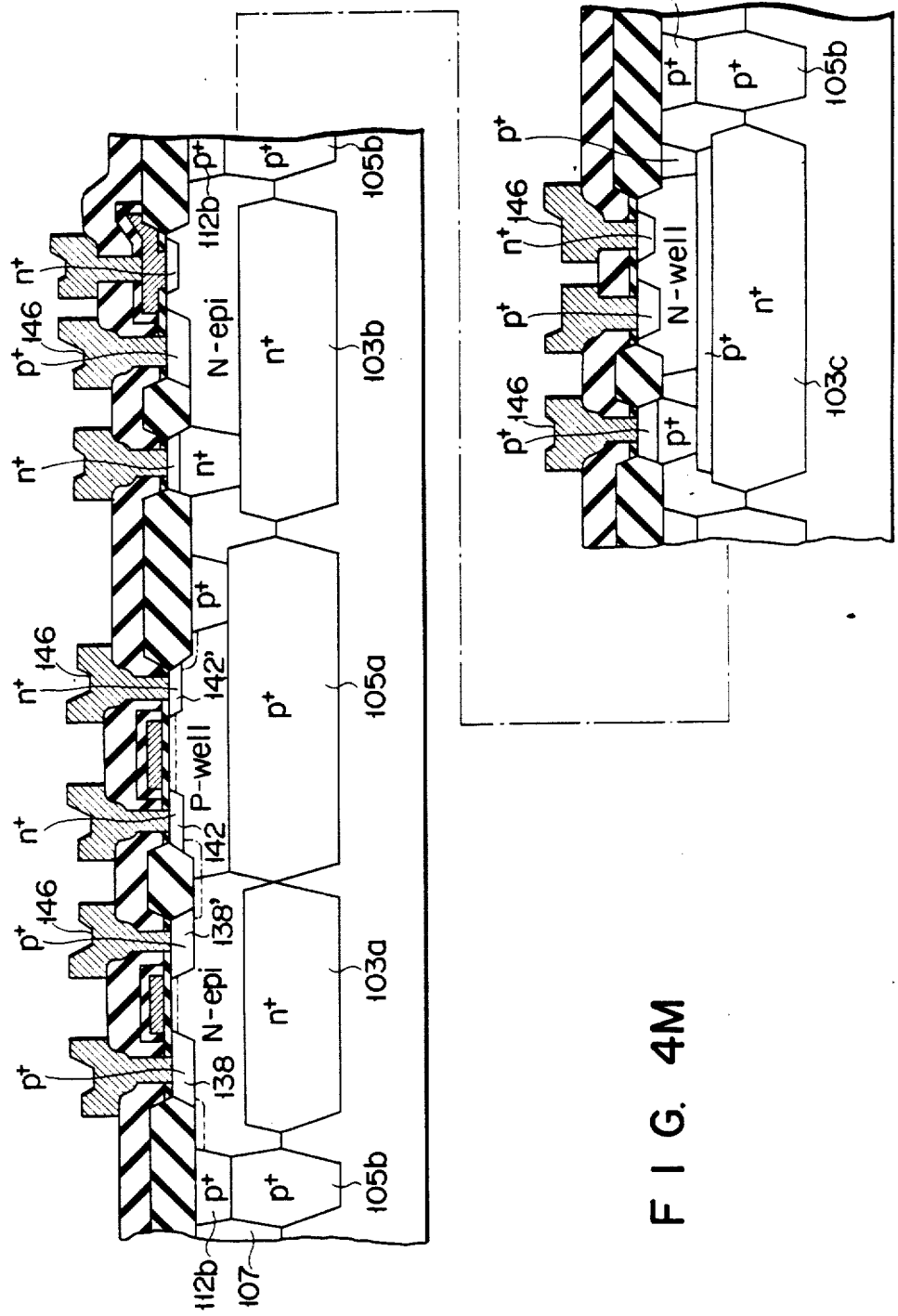

(XIII) Finally, a wiring metal film is deposited and patterned to form metal wiring 146, and then a semiconductor device including both the CMOSs and the complementary bipolar transistors can be obtained, as shown in FIG. 4M.

The CBi-CMOS of FIG. 4M obtained in the above manner comprises a structure having the main feature of the pesent invention described with reference to FIG. 3, thereby substantially preventing the latch up phenomenon as described hereafter.

First in the p-MOSFET portion, a parasitic pnp transistor having the p+-type source and drain regions 138 and 138' as an emitter, the n-type epitaxial layer 107 and the n+-type buried regions 103a as a base and the p-type substrate 101 as a collector generally forms a vertical pnp transistor having a large current amplification factor ($h_{FE}$). However, in this structure, since the base of the parasitic transistor has the n+-type buried region 103a, $h_{FE}$ becomes sufficiently smaller than 1. Alternatively, a lateral parasitic pnp transistor having the p+-type source and drain regions 138 and 138' as an emitter, the n-type epitaxial layer 107 as a base and the p-well 110 and the p+-type buried region 105a as a collector has a large $h_{FE}$, and is dominant rather than the vertical parasitic pnp transistor. However, also in the lateral parasitic pnp transistor, since a diffusion depth of the p+-type source and drain regions 138 and 138' is shallow and an impurity concentration of the base of the lateral parasitic transistor increases because of the channel cut region 121 in which phosphorus is ion-implanted, its $h_{FE}$ can be easily controlled to be sufficiently smaller than 1. On the other hand, in the n-MOSFET, a lateral parasitic transistor is formed by using the n+-type source and drain regions 142 and 142' as an emitter, the p-well 110 as a base, and the n-type epitaxial layer 107 of the p-MOSFET and the n+-type buried region 103a as a collector. However, its $h_{FE}$ can be easily controlled to be sufficiently smaller than 1 for the same reason as that of the above parasitic transistor. Therefore, the condition wherein the latch up phenomenon occurs, that is, the condition that the product of current amplificatio factors must be more than 1, cannot be satisfied. Then, the latch up phenomenon can be satisfactorily prevented.

Even if the product of current amplification factors becomes more than 1, parasitic resistances of the p-well 110 and the n-type epitaxial layer 107 are controlled to be 1/10 to 1/100 or less of that of a parasitic transistor in the conventional device due to the presence of the regions 103a and 105a. Therefore, the potential drop which directly triggers the latch up phenomenon can be controlled to prevent latch up. For the same reason, if an n+-type or p+-type diffusion layer is formed under an electrode extracting terminal of the n-type epitaxial layer of the P-MOSFET and an electrode extracting terminal of the p-well, a parasitic resistance can be decreased to effectively prevent the latch up phenomenon.

In this manner, the latch up phenomenon can be substantially prevented. The CBi-CMOS has a complementary structure in which both the npn and pnp vertical bipolar transistors are formed. Therefore, various advantages can be provided. For example, the circuit configuration for assuring sufficient open-loop gain of an Ope-Amp and for assuring a wider frequency range can be provided even if the power supply voltage is decreased. Furthermore, a circuit configuration for assuring sufficiently large current and high output and a high-speed output stage circuit configuration can be provided even if the power supply voltage is decreased.

Furthermore, as is apparent from the above manufacturing method, the n+-type and p+-type buried regions 103a and 105a in the CMOS part can be simultaneously formed when the n+-type buried regions 103b and 103c in the complementary bipolar transistor part and the p+-type buried region 105b for isolation are formed. Therefore, the CBi-CMOS can be effectively manufactured in a fewer number of steps. The p+-type isolation regions 112a and 112b, which are necessary for electrically isolating the bipolar transistor part, can be formed at a low temperature and in a short period of time in comparison with the case when the p+-type buried regions 105a and 105b are not formed. Accordingly, a CBi-CMOS including both these npn and pnp transistors and the CMOSs can be obtained without losing the conventional high performance of the npn and pnp transistors.

EXAMPLE 2

As described above, in the manufacturing method of Example 1, the p+-type emitter region 140 and the n+-type external base region 144 of the vertical pnp transistor are formed not by self-alignment, but by mask-alignment. Therefore, the vertical pnp transistor part has an undesired portion for mask-alignment, so that it becomes larger than other element parts, thereby obstructing high integration of the CBi-CMOS.

This embodiment relates to a structure and a manufacturing method thereof in which the p+-type emitter region 140 and the n+-type external base region 144 of the vertical pnp transistor can be formed by self-alignment.

Figure 6:
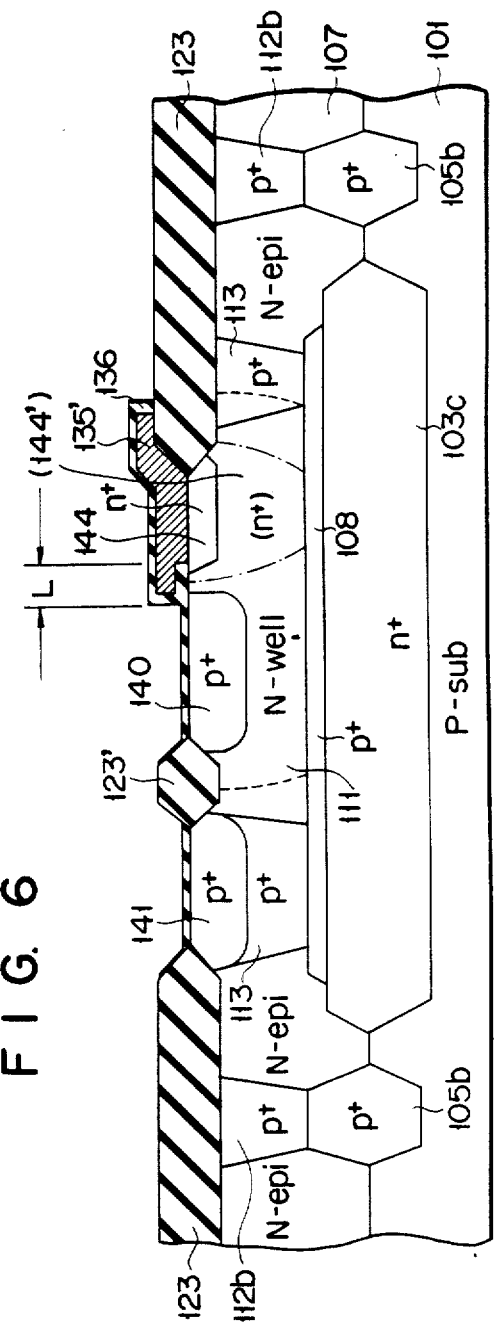
FIG. 6 is an enlarged sectional view of a vertical pnp transistor formed in the CBi-CMOS of another embodiment of the present invention.

FIG. 6 shows an enlarged sectional view of the vertical pnp transistor of the CBi-CMOS according to this embodiment. The structure of the CMOS part and the vertical npn transistor part are the same as in Example 1. The same reference numerals as in FIGS. 4A to 4M denote the same parts in FIG. 6. As shown in FIG. 6, in the CBi-CMOS of this embodiment, a base electrode 135' formed of an undoped polycrystalline silicon layer is provided so as to make ohmic-contact with an n+-type external base region 144. A p+-type emitter region 140 has a so-called walled structure such that one side thereof is in contact with an isolation oxide film 123'. In this structure, the p+-type emitter region 140 and the n+-type external base region 144 can be formed by self-alignment by using the following manufacturing method.

Before forming a polycrystalline silicon layer described in Example 1 with reference to FIG. 4I, an emitter diffusion window for a vertical npn transistor and an external base window for a vertical pnp transistor are respectively formed. Subsequently, the polycrystalline silicon layer is deposited on the entire surface of the resultant structure, and then phosphorus and arsenic are respectively doped in a CMOS part and a complementary bipolar transistor part of the polycrystalline silicon layer in the same manner as in FIG. 4I.

Then, an n+-type polycrystalline silicon layer 128 is patterned in the same manner as in FIG. 4J. In this case, gate electrodes 133 and 134 of the CMOSs, an emitter electrode 135 of the vertical npn transistor and a base electrode 135' of the vertical pnp transistor shown in FIG. 6 are respectively formed. Needless to say, the base electrode 135' has the same n-type impurity as that of the emitter electrode 135 by arsenic-doping. Subsequently, the resultant structure is annealed to form a thermal oxide film 136 on the respective surfaces of the electrodes 133, 134, 135, 135' and the like. By this annealing, arsenic is doped through the respective diffusion windows from the emitter and base electrodes 135 and 135'. As a result, an n+-type emitter region 137 of the vertical npn transistor is formed and an n+-type external base region 144 of the vertical pnp transistor is also formed, as shown in FIG. 6. Therefore, as is self-evident, the n+-type external base region 144 is formed by self-alignment in the same manner as that of the n+-type emitter region 137.

Next, boron is ion-implanted under the same conditions as in Example 1 without using a mask by, e.g., a resist pattern. Thereafter, annealing is performed to form a source and drain 138 and 138' of a p-MOSFET, an external base region 139 of the vertical npn transistor and the P+-type emitter region 140 and a p+-type collector contact region 141 of the vertical pnp transistor. In this case, as is apparent from FIG. 6, ion-implantation of boron is performed using a field oxide film 123, an isolation oxide film 123' and the base electrode 135' as a blocking mask in the vertical pnp transistor. Accordingly, boron is doped by self-alignment in predetermined regions.

Thereafter, the same processes as in Example 1 are performed, and a CBi-CMOS in which the vertical pnp transistor has the structure of FIG. 6 and the remaining portion has the structure of FIG. 4M can be obtained. In this manner, according to this embodiment, each impurity region of the vertical pnp transistor can be formed by self-alignment and the size of the device can be made compact.

Note that the above description relates to a vertical npn transistor in which the same impurity as that of the emitter electrode 135 of the vertical npn transistor (arsenic) is doped in the base electrode 135' of the vertical pnp transistor. If an impurity doped in the base electrode 135' is the same as the doped in the gate electrodes 133 and 134 of the CMOSs (phosphorus) and has the same concentration, the external base region of the vertical pnp transistor is formed not to be shallow as indicated by the reference numeral 144 but to be deep as indicated by the reference numeral 144', as shown in FIG. 6. In order to decrease the storage of minority carriers and to provide a high-speed device, it is preferable that a deep external base region as indicated by the reference numeral 144' is formed. However, in this case, the deep external base region 144' can be formed to be in contact with the p+-type emitter region 140. If the external base region 144' is in contact with the p+-type emitter region 140, the withstand voltage between the base and emitter thereof is considerably decreased. Therefore, in this case, a length L shown in FIG. 6 must be appropriately determined, such that the base electrode 135' can extend outward so as to block ion-implantation of boron, and the distance between the emitter region 140 and the base contact region 144' can be controlled.

Note that the structure and the method described in these embodiments can be employed not only in a CBi-CMOS, but also in a semiconductor device including only a complementary bipolar transistor without a CMOS.

What is claimed is:
1. A method for manufacturing a semiconductor integrated device comprising the steps of:
   selectively doping an impurity of a second conductivity type on a main surface of a semiconductor substrate of a first conductivity type to form a first high concentration buried region of the second conductivity type for bipolar transistors and a second high concentration buried region of the second conductivity type for a MOS transistor;
   selectively doping an impurity of the first conductivity type in said semiconductor substrate to form a third high concentration buried region of the first conductivity type surrounding said first high concentration buried region for the bipolar transistors and a fourth high concentration buried region of the first conductivity type for the MOS transistor;
   epitaxially growing a semiconductor layer of the second conductivity type on a surface of said semiconductor substrate in which high concentration buried regions are formed;
   selectively diffusing an impurity of the first conductivity type from a main surface of said semiconductor layer to form a well region of the first conductivity type reaching said fourth high concentration buried region;
   selectively performing high-concentration diffusion of an impurity of the first conductivity type in the main surface of said semiconductor layer, or selectively converting said semiconductor layer into an insulating layer, to form an electrical isolation region reaching said third high concentration buried region formed to surround said first high concentration buried region; and
   forming a vertical bipolar transistor and MOS transistors of a first and second conductivity type channel, said bipolar transistor being formed in the semiconductor region of the second conductivity type surrounded by said electrical isolation region, which includes said semiconductor region as the collector region, the MOS transistor of the second conductivity type channel being formed in said well region of the first conductivity type, and the MOS transistor of the first conductivity type chan- nel being formed on the semiconductor region of the second conductivity type positioned above said second high concentration buried region.

2. A method for manufacturing a semiconductor integrated device according to claim 1, wherein the step of forming a vertical bipolar transistor and MOS transistors of first and second conductivity type channel comprises:

selectively forming a field insulating film on a surface of said epitaxial semiconductor layer, thereby defining a first-conductivity type element region and second-conductivity type element regions, each element region being surrounded by said field insulating film;

forming a thin insulating film on surfaces of said element regions;

selectively doping one of said second-conductivity type element regions with an impurity of the first conductivity type, thereby forming a first-conductivity type active base region for the bipolar transistor;

forming gate electrodes for the MOS transistors on said insulating film formed on said first-conductivity type element region and a remaining second-conductivity type element region in which said active base region is not formed, said gate electrodes comprising polysilicon layers which are doped with an impurity and have a low resistance;

forming an emitter diffusion window in said thin insulating film on said active base region after said first-conductivity type active base region is formed;

forming an emitter electrode at the same time said gate electrodes are formed, said emitter electrode comprising a polysilicon layer doped with the second-conductivity type impurity, having a low resistance and extending through said emitter diffusion window and contacting said first-conductivity type active base region;

performing impurity diffusion by using said emitter electrode as a diffusion source to form a second-conductivity type emitter region in said second-conductivity type active base region;

selectively doping a second conductivity-type impurity, forming second conductivity type source and drain regions for the MOS transistor in said first-conductivity type element region, said second conductivity type surce and drain regions being 'self-aligned with said gate electrode of the MOS transistor; and selectively doping a first-conductivity type impurity to form an external base region of the first conductivity type in said first-conductivity type active base region and first-conductivity type source and drain regions for the MOS transistors in the remaining second-conductivity type element regions, said first-conductivity type source and drain regions being self-aligned with said gate electrodes of said MOS transistors.

* * * * *

UNITED STATES PATENT AND TRADEMARK OFFICE
CERTIFICATE OF CORRECTION

PATENT NO. : 4,694,562

DATED : September 22, 1987

INVENTOR(S) : Hiroshi IWASAKI, et al.

It is certified that error appears in the above-identified patent and that said Letters Patent is hereby corrected as shown below:

On the title page:

In the related U.S. Application Data

"which is a continuation of Serial No. 652,087"

should read as follows:

--which is a divisional of Serial No. 652,087--

Signed and Sealed this

Fifth Day of July, 1988

Attest:

DONALD J. QUIGG

Attesting Officer      Commissioner of Patents and Trademarks